(12) United States Patent
Andry et al.

(10) Patent No.: US 6,392,160 B1
(45) Date of Patent: May 21, 2002

(54) BACKPLANE FOR RADIO FREQUENCY SIGNALS

(75) Inventors: Steven C. Andry, Brooklyn, NY (US); Peter Giannoglou, Montclair, NJ (US); John S. Rucki, New Providence, NJ (US); Christopher F. Zappala, Whitehouse Station, NJ (US); Philip J. Hubbauer, West Caldwell, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/200,092

(22) Filed: Nov. 25, 1998

(51) Int. Cl.[7] ............................ H01R 12/04; H05K 1/11
(52) U.S. Cl. ........................................ 174/261; 439/63
(58) Field of Search .................... 174/33, 262, 261; 439/941, 63, 581; 361/785

(56) References Cited

U.S. PATENT DOCUMENTS

| | | | | |
|---|---|---|---|---|
| 4,904,968 A | * | 2/1990 | Theus .......................... 174/250 |
| 5,199,879 A | * | 4/1993 | Kohn et al. ..................... 439/63 |
| 5,308,250 A | * | 5/1994 | Walz .............................. 439/63 |
| 5,641,294 A | * | 6/1997 | Beard ........................ 439/63 X |
| 6,239,385 B1 | * | 5/2001 | Schwiebert et al. ......... 174/261 |

FOREIGN PATENT DOCUMENTS

JP          2-281699       * 11/1990

* cited by examiner

Primary Examiner—Albert W. Paladini
Assistant Examiner—Jeremy Norris
(74) Attorney, Agent, or Firm—Darby & Darby

(57) ABSTRACT

A multi-layer backplane for processing radio frequency (RF) and other signals has alternating layers of conductive traces for RF signals and other types of signals, and ground plane layers of conductive material electrically insulated from each other. The backplane upper layer has a plurality of coaxial connectors for connection of cables and other devices which supply RF energy signals to and convey them from the backplane, with each connector having a center pin extending into the backplane to make electrical contact with a trace of a selected trace layer. A ground plane cap layer of electrically conductive material is provided below the last ground plane layer associated with a trace layer and beneath the coaxial connector center pins for preventing leakage of radio frequency energy between the center pins. A row of conductive vias can be provided along one or more sides of a trace carrying RF energy. These vias are connected to electrical ground references above and below the layer of the trace to electrically isolate the trace from radiating the RF energy. Portions of transition conductive vias and plated-through holes for the connector center pins are removed to adjust to the impedance of components and cables to which they are to be connected.

18 Claims, 6 Drawing Sheets

BACKPLANE FOR RADIO FREQUENCY SIGNALS

FIELD OF THE INVENTION

This invention relates to a backplane for performing a number of functions, including processing of radio frequency signals.

BACKGROUND OF THE INVENTION

Backplanes are well-known devices in the electronics field that are typically used to provide interconnection and interfacing between various components and circuits. They often employ one ore more layers utilizing printed circuits, such as copper traces, to provide the interconnection. In multi-layer backplanes, the traces extend between layers to make connections between different circuits. One use for a backplane is with circuits that convey radio frequency signals. Such backplanes often employ one or more coaxial connectors. One type of backplane using coaxial connectors is shown in U.S. Pat. No. 5,641,294 granted Jun. 24, 1997. The backplane of that patent is to accommodate one or more circuit cards that are to be plugged into it and includes a plurality of coaxial connectors. The connectors are precisely aligned by mounting each of them on the backplane in a resilient bushing which permits limited connector movement.

In any piece of electronic equipment in which radio frequency signals are present, a problem arises where a plurality of coaxial connectors are located adjacent one another, in that leakage of the radio frequency energy occurs between the connectors. This results in possible interference between the circuits associated with the connectors. Also, leakage of the energy between one or more of the connectors and ground possibly results in making the RF signal noisy or otherwise corrupting it. Consideration also must be given to matching the impedance of certain components mounted on the backplane to that of other components, such as cables, which may be external to the equipment. In a backplane using printed circuit technology and having traces of conductive material, leakage of the radio frequency energy can also occur between the traces and cause signal interference. The foregoing '294 patent gives no consideration to these problems.

BRIEF DESCRIPTION OF THE INVENTION

The present invention is directed to a backplane of the multi-layer type for handling radio frequency signals which is constructed to overcome the aforesaid problems. The backplane also can accommodate other signals, such as digital data, and provide interconnection to power supply sources.

In accordance with the invention, the backplane has a plurality of layers with printed circuit traces, each for performing a particular function. For example, a printed circuit trace layer can be configured as or associated with a splitter of the radio frequency energy between various transmitter sources and/or one or more receivers, a coupler to couple signals from two or more sources, and so forth. Each of the printed circuit trace layers, has an associated ground plane layer of electrically conductive material separated from the trace layer by an electrical insulator, such as a sheet of dielectric material. A sheet of the dielectric material separates the conductive ground plane layer from the next layer of circuit traces.

The uppermost backplane layer, hereafter called the interface layer, is a combination of ground plane and circuit traces and has sockets for a plurality of coaxial connectors and for connection of other circuit components. The interface layer is separated from the next conductive trace layer by an electrical insulator, e.g., a dielectric material sheet. The backplane thereafter alternates with a trace layer, dielectric sheet, ground plane layer, dielectric sheet, trace layer for a desired number of iterations to the last ground plane layer for a trace layer. The backplane is completed by adding a dielectric sheet to the ground plane layer of the lowermost circuit trace layer and finally a conductive "cap" layer which caps, or completes, the backplane with an overall ground plane.

The center pin of each coaxial connector extends into the backplane to make electrical contact with a trace on a selected one of the printed circuit trace layers. The ground part of each connector is electrically connected to each ground plane layer through which it passes and the ground plane layer surrounds the center pins of the coaxial connectors passing therethrough. The ground plane cap layer is electrically connected to one or more of the other ground plane layers and prevents unwanted radiation of RF energy between adjacent connectors.

In a preferred embodiment of the invention, the backplane is also provided with vias, which are through-holes plated with an electrically conductive material. The vias extend from the upper interface layer to the lowermost ground plane layer of a trace layer. The vias preferably are spaced apart, similar to a stitching pattern, and are located between traces of the trace layers to also prevent leakage of the radio frequency energy from one trace to another. The spacing of the vias is selected as a function of the wavelength of the energy carried by the associated trace. Also, the invention controls the impedance of the connectors by removing conductive material from layers below the terminal end of a connector center pin and from transition vias below a point of connection to a trace, down through the cap layer.

BRIEF DESCRIPTION OF THE DRAWINGS

Other objects and advantages of the present invention will become more apparent upon reference to the following specification and annexed drawings in which.

DETAILED DESCRIPTION OF THE INVENTION

Figure 1:
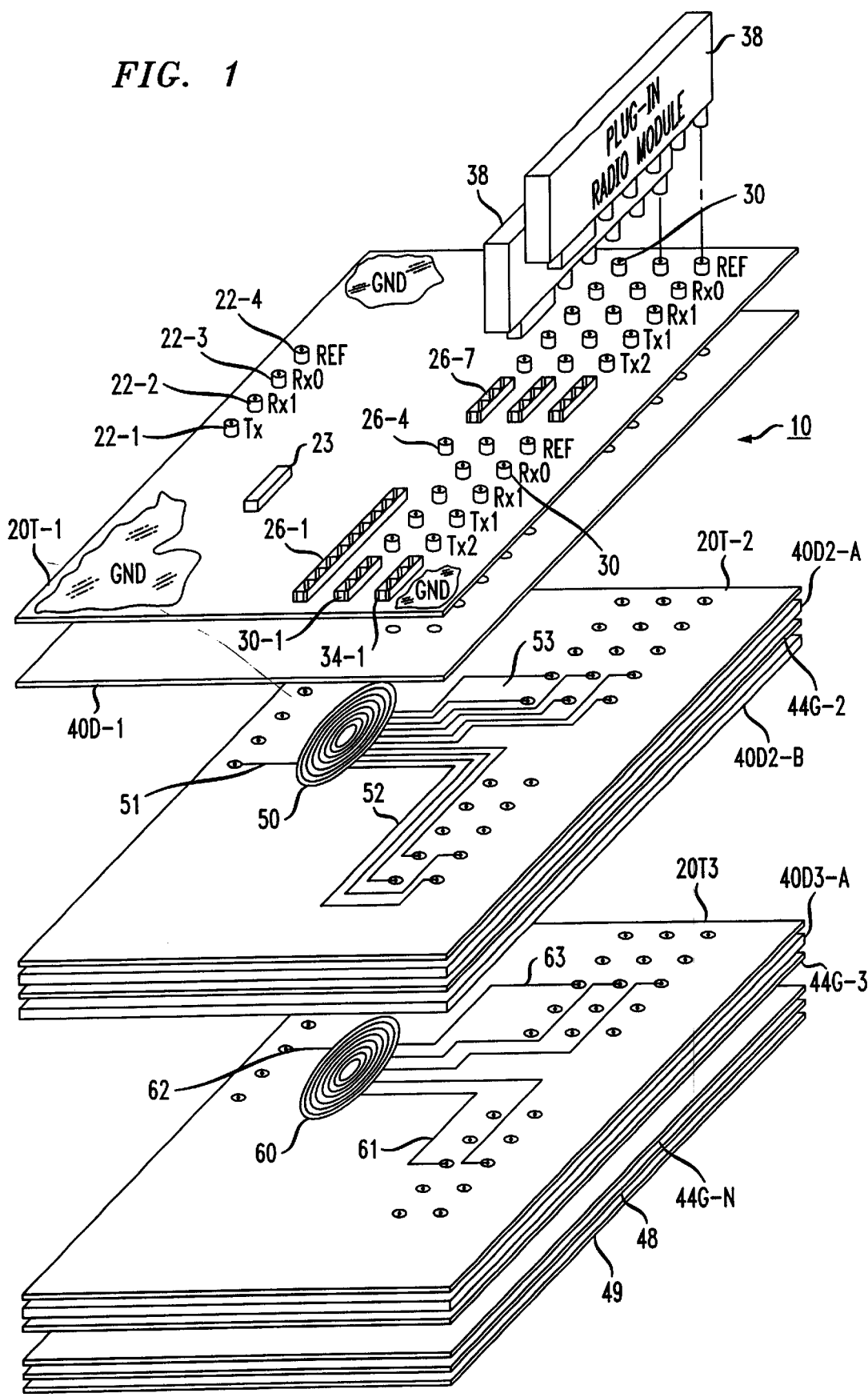
FIG. 1 is an exploded perspective view of the backplane of the invention.
Figure 1A:
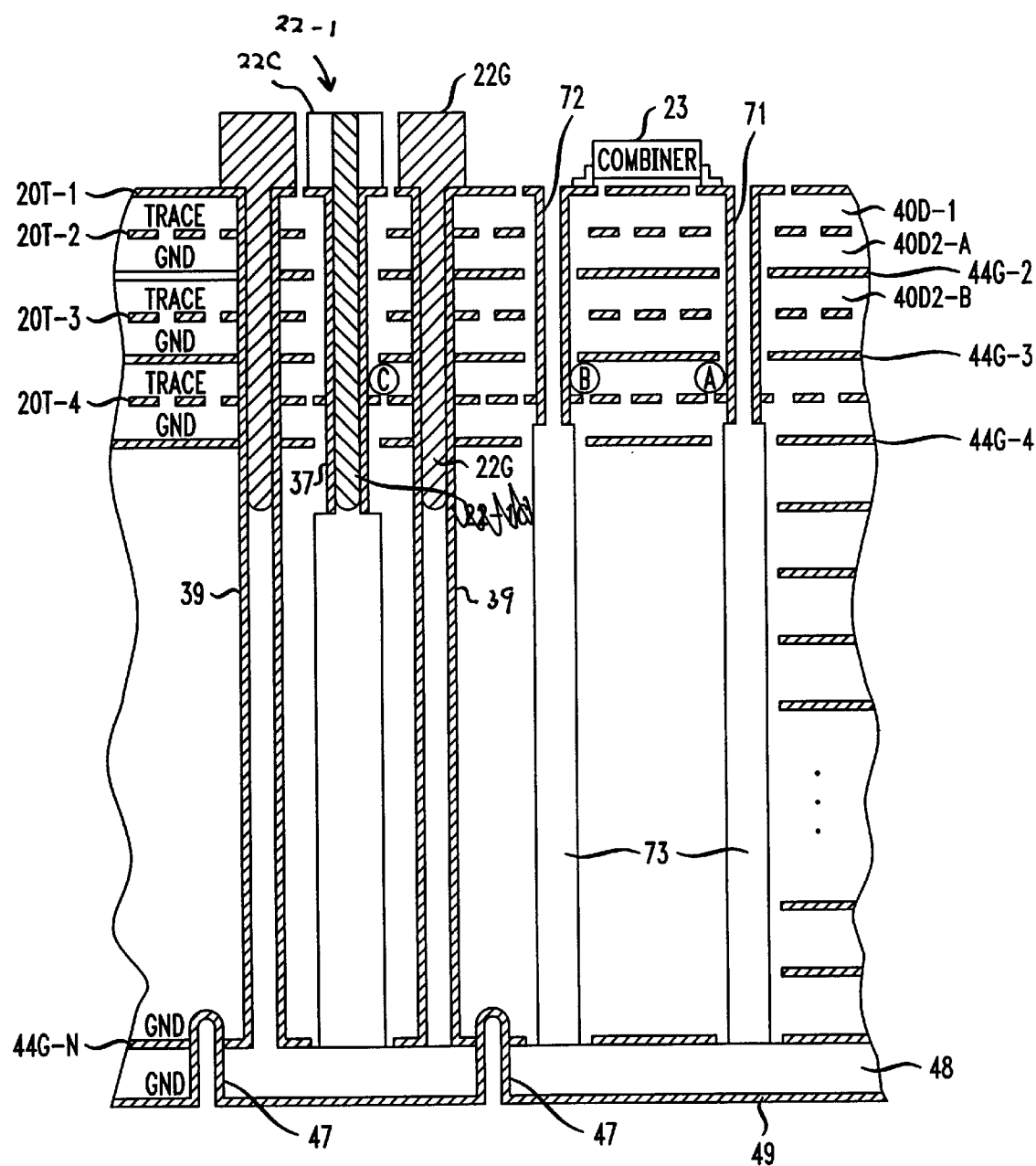
FIG. 1A is an elevational cross-sectional view of a portion of the backplane of FIG. 1.

Referring to FIGS. 1 and 1A, the multi-layer backplane 10 is shown respectively in an exploded perspective view and a cross-sectional view. In the following description the term "layer" is applied to a portion of the backplane that has electrically conductive material, such as copper, used as conductive traces for printed circuits and/or for electrical ground, e.g., ground plane, purposes. The backplane 10 is illustratively described as adapted to be used with a cellular or PCS telephone station to perform various functions. These functions include splitting, combining and distributing radio frequency (RF) signals from one or more receivers; supplying RF signals to be transmitted to one or more transmitters; processing such signals in one or more radio modules that are to be plugged into the backplane, and interfacing with external RF infrastructures, such as amplifiers, filters, and antennas.

The backplane uses printed circuit media to convey the signals in a manner to minimize RF transmission losses through impedance matching and by minimizing the size of the backplane. This is done while maximizing isolation between the RF energy transmission paths. The backplane eliminates the need for discrete cables and providing external connection between RF combining and splitting devices, thus reducing overall system cost and size. Backplane 10 also has capabilities for conveying digital and analog signals, as well as for making connections for power supply.

As seen in FIG. 1A, the backplane has an uppermost combination surface trace and ground layer 20T-1 over a dielectric sheet 40-D1 which insulates the conductive material of layer 20T-1 from the next trace layer 20T-2. The trace layer 20T-2 is on a dielectric sheet 40D2-A which electrically insulates it from an associated ground plane layer 44G-2 of electrically conductive material. The ground plane layer 44G-2 is electrically insulated from the next trace layer 20T-3 by a dielectric sheet 40D2-B. As seen, the trace layer 20T-2 has its own respective ground plane layer 44G-2 and this ground plane layer is insulated from the next trace layer by a dielectric sheet 40D2-B.

The alternation of a trace layer 20T, dielectric sheet 40D-A, ground plane layer 44G and dielectric sheet 44D-B continues to the bottom of the backplane in as many replications as required for the backplane. For example, as shown, the backplane is to have N trace layers, ending in the final ground plane layer 44G-N for the last trace layer.

Thereafter, the last ground plane layer 44G-N is separated by a dielectric sheet 48 covered by a final cap conductive ground plane layer 49, whose function is described below. The ground plane cap layer 49 is electrically connected by conductive vias 47 extending through the dielectric sheet 48 to make electrical connection with the lowermost trace layer ground plane 44G-N, associated with a trace layer, as shown in FIGS. 1A, 2C and 2E. Alternatively, vias 91 may be used which extend through the backplane and connect the cap layer 49 to all ground reference planes 44 of the backplane and to an electrical ground reference on the interface layer 20T-1, as shown in FIGS. 2B and 2D.

In the exemplary backplane 10 described, the upper layer 20T-1 is for interface purposes and has a combination of traces and an electrical ground reference. The ground reference is designated GND and is arrayed as part of layer 20T-1, as required. Interface layer 20T-1 provides access through connectors mounted to it and to other trace layers of the backplane to receive signals from or convey signals to traces on these other layers. Also, as illustrated, trace layers 2OT-2, 20T-3 and 20T-4 handle RF signals and the remaining trace layers handle other signals, such as digital and analog, and provide connections to power supply functions. Thus, the RF signals are confined to one section of the backplane. Other configurations of the layers can be used as needed.

The interface layer 20T-1 has a plurality of coaxial connectors and various types of sockets, such as for providing connections to external circuit devices, and one or more surface mounted RF devices, such as a splitter. These are arranged in a pre-determined geometric pattern. Each of the coaxial connectors has a single center pin and the device sockets have multiple pins which extend into the backplane until the respective pin comes into electrical contact with a predetermined trace of a predetermined layer to which the respective connector center pin or socket pin is to make electrical contact. The geometric pattern of the arrangement of these elements corresponds to the traces on trace layers 20T below the interface layer 20T-1 to which the pins are to be connected.

In FIG. 1, there is illustratively shown on interface layer 20T-1 a first component row of four coaxial connectors 22-1 through 22-4. Connector 22-1 is to have a cable connected thereto which is to be ultimately connected to an external transmitter of radio frequency signals. The coaxial connectors 22-2 and 22-3 are to have cables connected thereto from different receivers of radio frequency energy, while connector 22-4 is to have a cable connected to a reference signal frequency source which sets the timing for RF components of the backplane and for other purposes. In the drawing, those connectors associated with RF transmission are designated Tx, those which receive RF energy are designated Rx, and those with a reference frequency signal are designated as REF. Each of the coaxial connectors 22 has a center pin which is to be electrically connected to a trace conductor of a selected printed circuit layer below interface layer 20T-1.

An RF combiner 23 is shown as a surface mounted device. This has electrical terminals on layer 20T-1 (see FIG. 1A) to which contact is made from the traces of other layers, as shown in FIG. 1A. It is also possible, if desired, to implement the circuit of some surface mounted RF devices by using a printed circuit pattern on a trace layer or layers.

The next row of components on the interface layer 20T-1 includes a group of sockets, or plugs, 26 which serve as pin fields for electrical connection with plugs or sockets of external circuits for performing any function, such as signal processing by a digital signal processor circuit. There is also another coaxial connector 26-4, for example, which is to accept a connector which can be part of a module plugged into pin field socket 26. The row illustratively has a second pin field socket 26-7 and is completed by a set 30 of five blind mate plug-in RF coaxial connectors which are to accept and interface with a plug-in radio module 38. Two of the plug-in radio modules 38 are shown. These are standard packages and form no part of the present invention. Other sets of the blind mate plug-in connectors 30 are shown, there being two each in the next two rows. The layout shown is only illustrative and there can be any configuration of coaxial connectors 22, sockets 26 and sets of blind mate plug-in connectors 30 as needed and desired.

In accordance with the backplane layout pattern, each layer and dielectric sheet has holes through which each of the pins of the connectors and sockets pass without making electrical connection until they reach the trace layer having the trace to which electrical connection is to be made.

The trace layer 20T-2, in the illustrative example being described, is used to process signals by an RF splitter, which can be a surface mounted device that supplies RF signals to the external transmitters via the coaxial connectors 22 on the interface layer 20T-1. Layer 20T-2 is made by conventional printed circuit technology and has thereon a plurality of traces extending from an illustrative common trace 50, which actually is the junction of a number of traces and connection traces that lead to surface mounted devices. As seen, for example, one of the traces 51 extends to a location aligned under the Tx coaxial connector 22-1, so it can be connected to the center pin of this connector. Other traces 52 and 53 of layer 20T-2 are positioned to have ends associated with other of the coaxial connectors of the interface layer. Below the trace layer 20T-2 is a dielectric layer 40D2-A and below that its associated ground plane layer 44G-2.

The next lower trace layer 20T-3 is illustratively shown as used for processing RF signals relative to a receiving function. Layer 20T-3 shows a common trace 60 which represents the junctions of a plurality of traces that perform combining and splitting functions, and from which connections can be made to the pins extending from the coaxial connectors 22 and 30, and surface mounted devices on the interface layer 20T-1 which are associated with the receiver function. For example, as shown, there are traces 61 and 63 which extend to one of the connectors 30 of the plug-in modules 38, and trace 62 which can be connected to the receiver coaxial connector 22-3.

FIG. 1 does not show trace layers below 20T-3. Trace layer 20T-4, shown in FIG. 1A, would have a trace pattern necessary to perform another RF signal function. As illustratively shown, the trace layers below 20T-4 are used to perform different functions. For example, there are trace layers corresponding to the connections for the pins extending from the various sockets 26-1. It is preferred that RF signals and other types of signals are not processed on the same layer. It is preferred that RF transmitter and receiver functions be divided and accommodated by different trace layers and associated ground planes so that transmitter and receiver RF signals are not processed in one trace layer where they could interfere with one another.

FIG. 1A shows one coaxial connector of the backplane, illustratively 22-1 for the transmitter function, that is mounted to the interface layer 20T-1. Each of the connectors 22, which can be of the press fit type, may be circular, or of any other suitable shape, and has an outer sleeve, or set of pins, 22G used to mount the connector to the backplane. The connector is grounded through a vertically extending circular channel, or set of channels, 39 that accepts the sleeve or pins 22G of the connector body and extends though the backplane to the last ground plane layer 44G-N. Each channel 39 is electrically connected to each ground plane of the board from the interface layer, all intermediate ground plane layers 44 and to the last ground plane layer 44G-N.

The connector center pins 22C are in plated-through holes 37 with connector center pin 22C shown as being electrically connected to a trace of trace layer 20T-4 at C. The plated-through hole 37, above and below trace layer 20T-4, does not make electrical contact with a trace on any other layer. The end of connector center pin 22C is shown illustratively terminating somewhat below the ground plane layer 44G-4 of the last trace layer 20T-4 that handles RF signals. A center pin can have a length which terminates at any desired point. The portion of the plated-through hole 37 below the terminal end of connector center pin 22C down to the last ground plane layer 44G-N is removed, such as by drilling, to remove the conductive plating. The reason for this is described below in connection with FIG. 3.

FIG. 1A also illustratively shows two transmission vias 71 and 72 extending vertically in the backplane. These are used to make connections between the surface mounted RF device 23 and certain traces for RF energy in the transmission path of a trace layer. The vias 71 and 72 are through-holes plated, originally down to the bottom ground plane layer 44G-N, and then the plating is removed, as shown by 73, to a point below the trace layer on which electrical connection is made. The reason for this is described below. As shown in FIG. 1A, for purposes of illustration, there is a connection from point "A" on layer 20T-4 through via 71 to one of the terminals of the surface mounted RF combiner 23, and from point "B" on layer 20T-4 to combine 23 through via 72. Further, there is a connection from point "B" through traces (not shown) on layer 20T-4 to point "C" which is the connector center pin 22C.

Figure 2A:
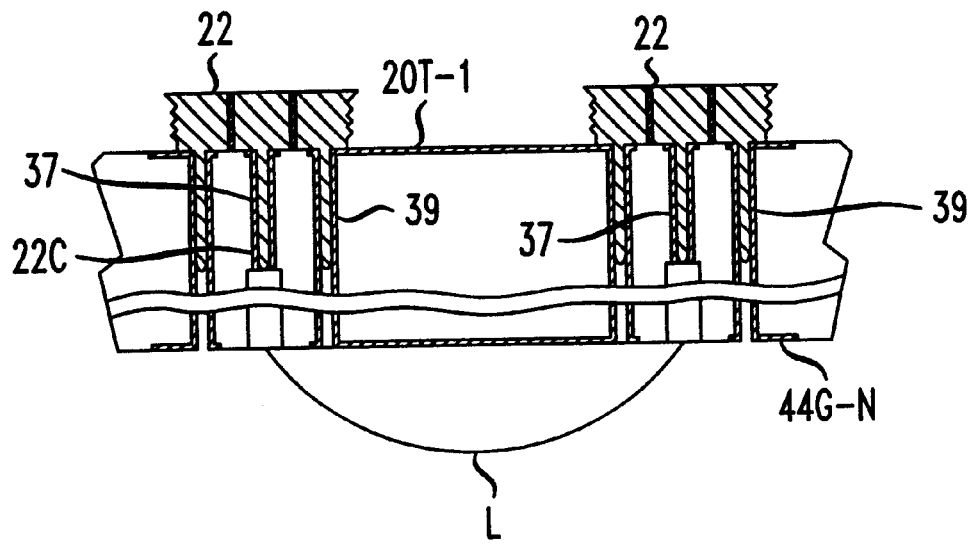
FIG. 2A is a cross-section of a portion of the backplane without the use of a ground plane cap.
Figure 2B:
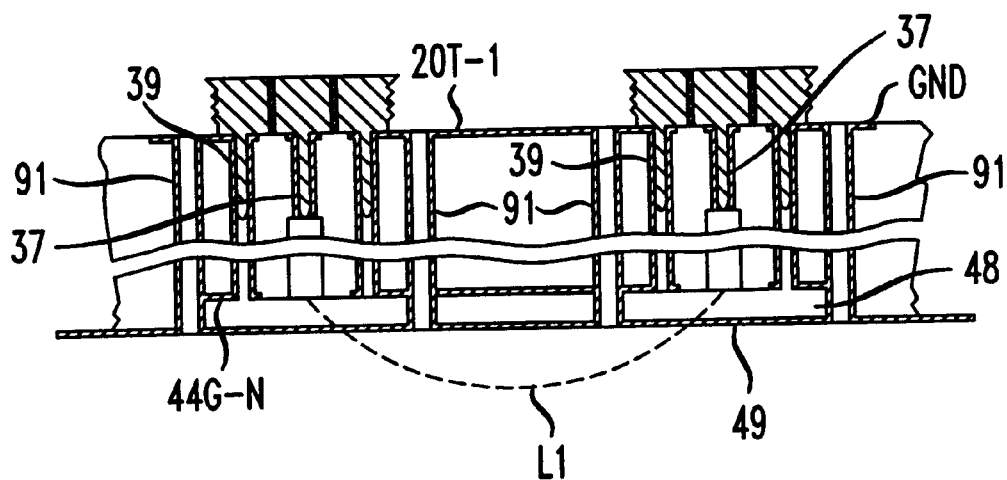
FIGS. 2B–2E are cross-sectional views of a portion of the backplane showing different embodiments of the ground plane cap layer.
Figure 2C:
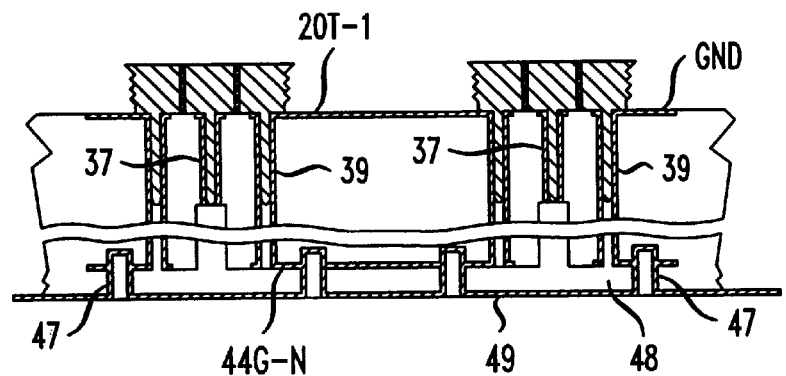
Figure 2D:
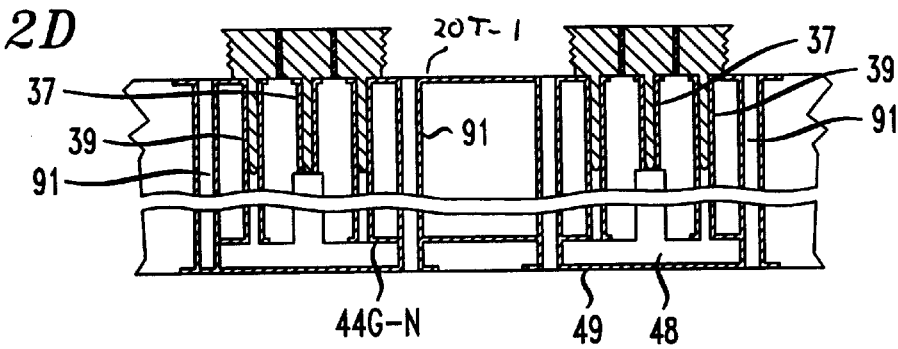
Figure 2E:
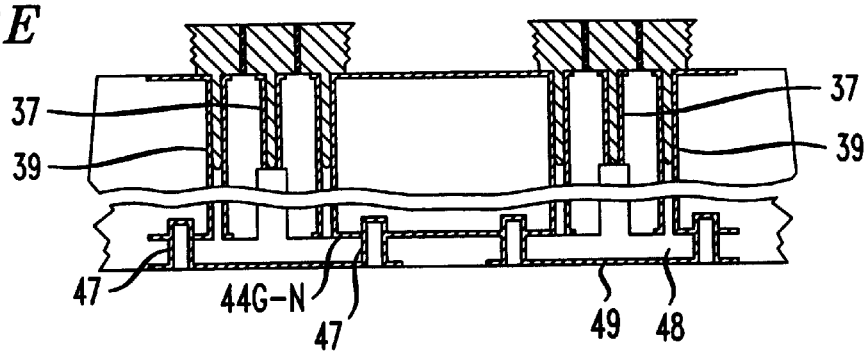

Referring to FIGS. 2A–2E, the purpose of the ground plane cap layer 49 is now described. Each of these Figures shows a portion of a backplane with two adjacent coaxial connectors. FIG. 2A shows a prior art backplane without the cap layer 49. As shown by the solid line L, there is a leakage path for the RF energy from the center pins of the two coaxial connectors. This leakage is to be eliminated if possible. Such a leakage path does not exist on the interface layer because of the isolation that each connector body provides for the signal at its respective center contact.

FIGS. 2B–2E show the same portion of a backplane as in FIG. 2A but with the addition of the cap back plane layer 49. In FIG. 2B the cap layer 49 extends over the entire surface of dielectric sheet 48. There are full length conductive vias 91 from a ground (GND) reference trace on the interface layer 20T-1 through all of the board layers to the cap layer 49. Each via 91 electrically contacts each of the ground plane layers as it extends through the board. This closes off the leakage path between the center pins 22C of the two adjacent connectors, as shown by the dashed line L. That is, the cap layer 49 isolates each connector and prevents leakage of RF energy between the connector center contacts.

FIG. 2C corresponds to FIG. 1A and the ground plane cap layer 49 overlies the entire dielectric sheet 48. Here there are conductive vias 47 from cap ground plane 49 to the next adjacent, i.e., the lowermost, ground plane layer 44G-4 that is associated with a trace layer. Again, there is no leakage path for RF energy between the center pins of the two coaxial connectors. Also, the vias 47 do not extend completely through the board like vias 91 in FIG. 2B. It may be more advantageous to have a via, such as 47, that extends only partly through the board rather than a full depth via, such as 91, since the holes for the vias are usually made after the multi-layer board is fully assembled. That is, it is easier to make a hole of lesser depth.

In FIG. 2D there are the full length vias 91 from the interface layer 20T-1 to the cap layer 49, like in FIG. 2B. Here, as distinguished from FIG. 2B, the cap layer 49 is in patches. That is, the cap layer is not co-extensive with the entire lower surface of the dielectric sheet 48 but is only on the areas overlying two adjacent coaxial connector center pins. This still serves to prevent RF energy leakage between the center pins of the two connectors.

In FIG. 2E the partial vias 47 are used as in FIG. 2C. The difference here, like in FIG. 2D, is that there are only patches for the cap layer 49 instead of the full co-extensive layer as in FIG. 2D. The desired result of blocking leakage of the RF energy is still obtained.

Figure 3A:
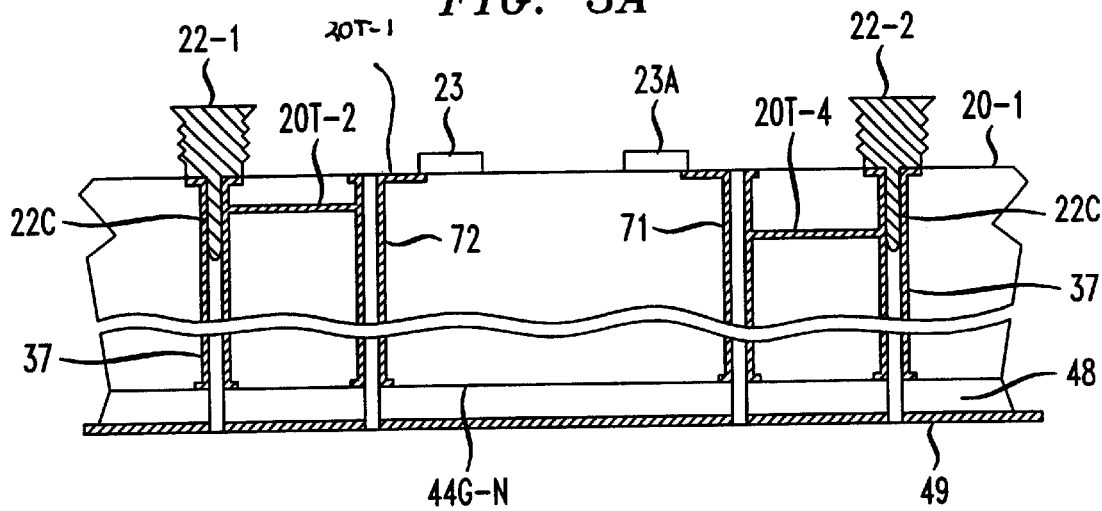
FIG. 3A is an elevational cross-section of one of the printed circuit layers of the backplane before modification to improve impedance matching and FIG. 3B shows the layer after modification.

It is desired to construct the backplane with impedances matched as closely as possible to various elements on the backplane and to cables of external circuits which are to be connected to the backplane. Referring to FIG. 3A, a portion of the backplane is illustratively shown having two connectors 22-1 and 22-2 on the top layer 20T-1 as well as two surface mounted RF components, such as a combiner or splitter, 23 and 23A. The center pin 22C of each of the connectors is shown in its plated hole 37 extending down to the last trace layer or the dielectric sheet above it. The portions of the conductive connector through holes 37 below the terminal ends of the center pins 22C and the portions of the conductive transition vias 71 and 72 below the trace layer at which connection is made to the connector center pin alters the impedance of the connectors 22 and the respective RF device 23 and 23A. This can be capacitive and/or inductive, but in most cases it is undesired.

Figure 3B:
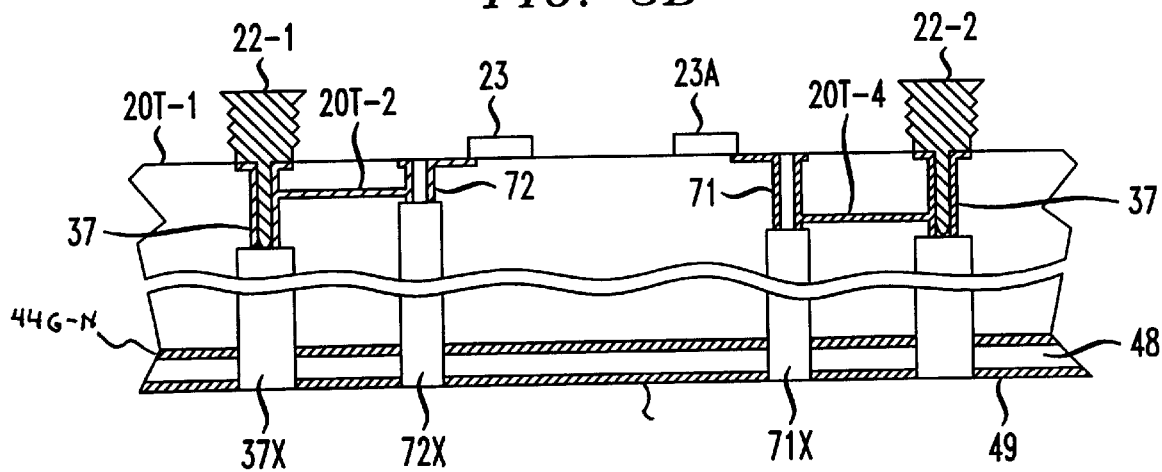

FIG. 3B shows the same portion of the backplane of FIG. 3A in which the excess conductive material is removed from the connector center pin through-holes 37, from the lowermost ground plane layer 44G-N up to a point below the terminal ends of the center pins. It may also be removed through the dielectric 48 and the end cup 49. This is shown by an enlargement 37X of the through-hole. Such removal of the conductive material may be accomplished, for example, by drilling the backplane from the lowermost ground plane 44G-N to the desired point before the dielectric layer 48 and cap layer 49 are attached. This is called "back drilling". Similarly, the transition vias 71 and 72 are back drilled at 71X and 72X to remove the conductive material up to a point below the trace layer it uses for making contact to the connector center pin. This removes the excess conductive material in the through-hole or via to eliminate its effect on the connector 22 or surface mounted RF device 23.

Figure 4A:
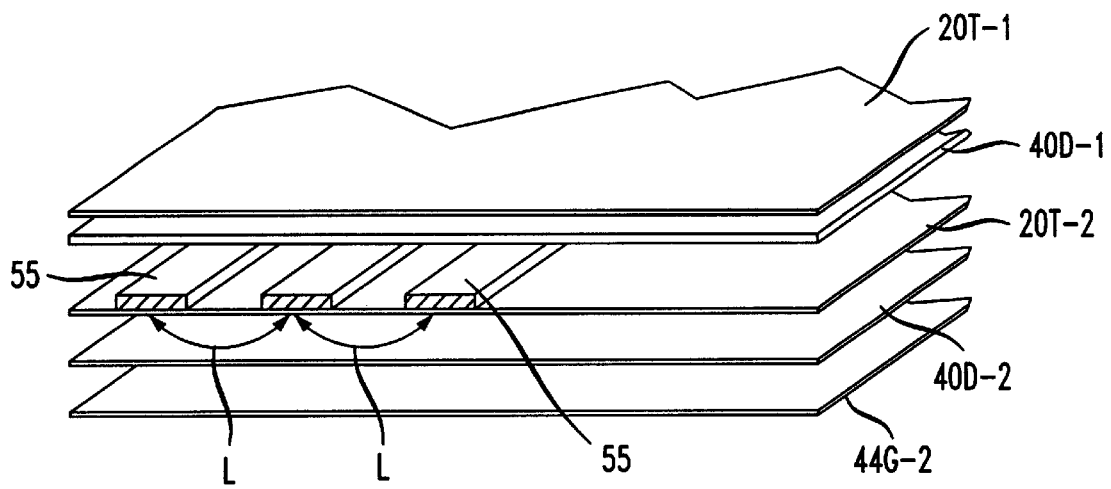
FIG. 4A is an exploded perspective view of a portion of the backplane illustrating potential leakage paths between traces on a trace layer and FIG. 4B illustrates an arrangement for reducing the leakage of RF energy between the traces on the trace layer.
Figure 4B:
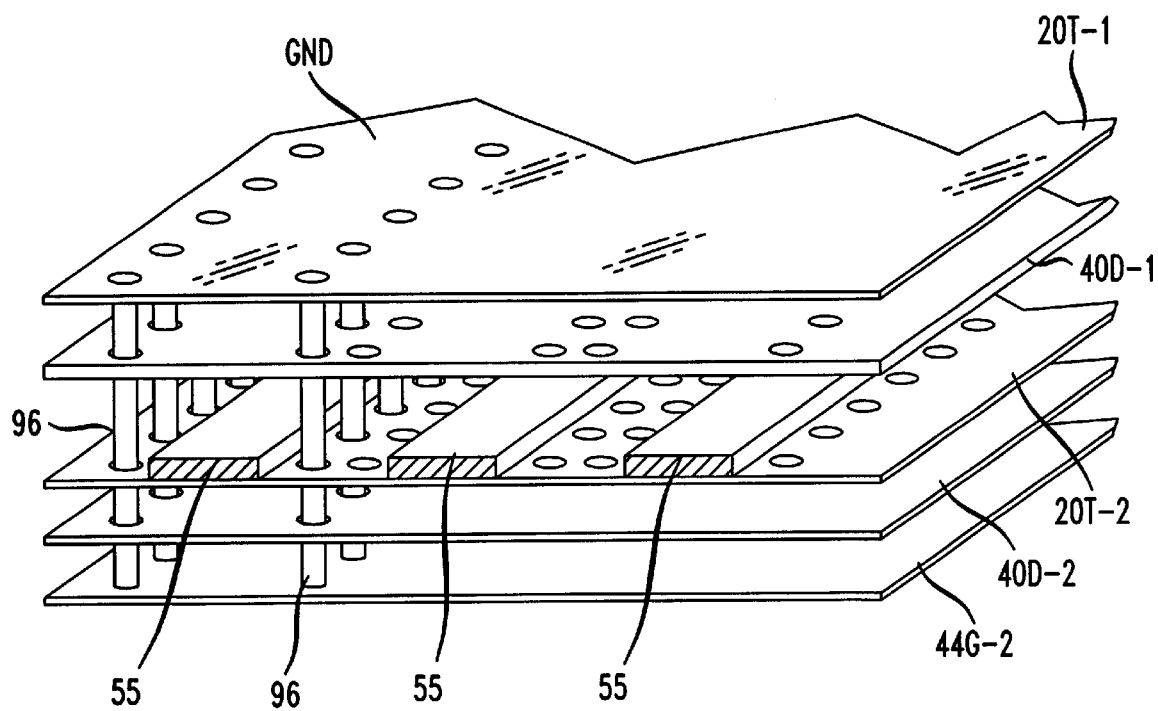

FIGS. 4A and 4B show the advantages of the use of vias to prevent leakage of RF energy between the traces of a trace layer carrying such energy. In each of these Figures a portion of the backplane is shown, this being the top layer 20T-1, a dielectric sheet 40D-1 between the top layer and layer 20T-2 which handles RF energy, a dielectric sheet 40D-2 and a ground plane layer 44G-2. The layer 20T-2, as described with respect to FIGS. 1 and 1A, has traces 55 on which RF energy is flowing. As seen in FIG. 4A, and as shown by the arrows L, there is leakage between the traces. This can cause noise in and distortion of the signal.

In FIG. 4B, a stitch type pattern of a line of conductive vias 96 is provided along each side of a trace 55. The spacing of the vias is selected as a function of the wavelength ($\lambda$) of the signal carried by the trace. The spacing can be, for example, $\lambda/20$. The vias 96 are plated through holes and in FIG. 4B are shown extending from the top layer 20T-1, where contact is made with a ground potential portion GND, and a ground plane layer below the trace layer 20T-2, here 44G-2. This isolates RF energy from leaking from a trace 55 since there is a ground reference running along each side of the trace. As applied to any other trace layer, the requirement is that the lines of vias 96 are in electrical contact with each of the ground plane layers 44 above and below the trace 55 that is to be isolated. If desired, the vias 96 can extend either further up and/or down from the trace layer containing the trace 55 to be isolated. The lines of vias 96 isolate one trace from another from the RF point of view, and thereby reduce or substantially eliminate leakage of RF energy between the traces. The via stitching, used in combination with the cap layer 49, reduces RF energy leakage substantially throughout the backplane.

While the present invention has been shown and described with respect to various embodiments, it will be understood by those skilled in the art that various changes and modifications can be made therein without departing from the spirit and scope of the invention as defined by the appended claims.

We claim:

1. A multi-layer backplane comprising
  alternating layers of conductive traces for radio frequency signals and ground plane layers of conductive material electrically insulated from each other by a layer of insulating material;
  an upper layer having at least one connector with a center pin extending into the backplane to make electrical contact with a trace of a selected trace layer below said upper layer;
  a ground plane cap layer of electrically conductive material extending over the outer surface of a lowermost layer of insulating material below the last ground plane layer, said ground place cap layer being beneath said center pin for preventing leakage of radio frequency energy from said connector; and
  a plated through-hole of electrically conductive material into which the center pin of a said connector is inserted, the electrically conductive material of said throughhole being absent from the lowermost ground plane layer of the backplane to a point somewhat below the terminal end of the said center pin to effect the impedance of said connector.

2. A multi-layer backplane as in claim 1 wherein there are a plurality of said connectors each having a respective center pin extending into said backplane to make electrical contact with a trace of a respective trace layer, said cap layer extending beneath the center pins of said plurality of connectors to prevent leakage of radio frequency energy between the connectors.

3. A multi-layer backplane as in claim 2 wherein the electrical insulation between said last ground plane layer and said cap layer is a dielectric sheet, and said cap layer extends over substantially the entirety of said dielectric sheet.

4. A multi-layer backplane as in claim 2 wherein the electrical insulation between said last ground plane layer and said cap layer is a dielectric sheet, and said cap layer is discontinuous and extends over portions of said dielectric sheet in line with said coaxial connectors.

5. A multi-layer backplane as in claim 1 further comprising at least one electrically conductive connection between said cap layer and one of said ground plane layers into said backplane.

6. A multi-layer backplane as in claim 5 wherein said at least one electrically conductive connection comprises a through-hole via of electrically conductive material from said cap layer to said ground plane layer.

7. A multi-layer backplane as in claim 5 wherein said at least one electrically conductive connection is between said cap layer and the lowermost ground plane layer.

8. A multi-layer backplane as in claim 1 wherein said upper layer has an electrical ground reference and further comprising at least one electrically conductive connection from said cap layer into said backplane to the ground plane layers above said cap layer and to said electrical ground reference of said upper layer.

9. A multi-layer backplane as in claim 8 wherein said at least one electrical connection comprises a through-hole via of electrically conductive material.

10. A multi-layer backplane as in claim 1 wherein a first group of adjacent trace layers process radio frequency signals and a second group of said trace layers process signals of non-radio frequency character.

11. A multi-layer backplane as in claim 1 wherein one of said layers of traces has two adjacent traces and at least one of said two adjacent traces carries radio frequency energy; and further including a plurality of spaced vias of electrically conductive material along at least one side of said at least one trace carrying radio frequency energy, said plurality of vias extending through said backplane and being electrically connected to electrical ground references above and below said one layer.

12. A multi-layer backplane as in claim 1 further comprising:
   a plurality of spaced vias of electrically conductive material along at lease one side of said at least one trace carrying the radio frequency energy extending through said backplane and electrically connected to electrical ground references above and below said one layer of electrically conductive traces.

13. A multi-layer backplane as in claim 12 wherein said plurality of vias are electrically connected between ground plane layers above and below said one layer of electrically conductive traces.

14. A multi-layer backplane as in claim 12 wherein there are a plurality of spaced vias along each side of said at least one trace carrying the radio frequency energy.

15. A multi-layer backplane as in claim 1 wherein one of said layers has two electrically conductive traces, at least one of which carries radio frequency energy; and
   a plurality of spaced vias of electrically conductive material along at least one side of said at least one trace carrying the radio frequency energy extending through said backplane and electrically connected to electrical ground references above and below said one layer of electrically conductive traces.

16. A multi-layer backplane comprising
   alternating layers of conductive traces for radio frequency signals and ground plane layers of conductive material electrically insulated from each other by a layer of insulating material;
   an upper layer having at least one connector with a center pin extending into the backplane to make electrical contact with a trace of a selected trace layer below said upper layer;
   a ground plane cap layer of electrically conductive material extending over the outer surface of a lowermost layer of insulating material below the last ground plane layer, said ground plane cap layer being beneath said center pin for preventing leakage of radio frequency energy from said connector; and
   a radio frequency device mounted to the upper surface of said upper layer and a via of electrically conductive material extending into said board and connecting a terminal of said device to a trace on a respective one of said trace layers, the conductive material of said via being absent from the lowermost ground plane layer of the backplane extending to a point somewhat below said one trace layer.

17. A multi-layer backplane comprising
   alternating layers of conductive traces for radio frequency signals and ground plane layers of conductive material electrically insulated from each other by a layer of insulating material;
   an upper layer having at least one connector with a center pin extending into the backplane to make electrical contact with a trace of a selected trace layer below said upper layer;
   wherein one of said layers of traces has two adjacent traces and at least one of said two adjacent traces carries radio frequency energy; and further including a plurality of spaced vias of electrically conductive material along at least one side of said at least one trace carrying radio frequency energy, said plurality of vias extending through said backplane and being electrically connected to electrical ground references above and below said one layer;
   a ground plane cap layer of electrically conductive material extending over the outer surface of a lowermost layer of insulating material below the last ground plane layer, said ground plane cap layer being beneath said center pin for preventing leakage of radio frequency energy from said connector; and
   a plated hole of electrically conductive material into which the center pin of a said connector is inserted, the conductive material of said hole being absent from the lowermost ground plane layer of the backplane to a point somewhat below the terminal end of a said center pin.

18. A multi-layer backplane as in claim 17 further comprising a radio frequency device mounted to the upper surface of said upper layer and a via of electrically conductive material extending into said board and connecting a terminal of said device to a trace on a respective one of said trace layers, the conductive material of said via being absent from the lowermost ground plane layer of the backplane extending to a point somewhat below said one trace layer.

* * * * *